United States Patent [19]

Bose et al.

[11] Patent Number: 5,492,858

[45] Date of Patent: Feb. 20, 1996

[54] SHALLOW TRENCH ISOLATION PROCESS FOR HIGH ASPECT RATIO TRENCHES

[75] Inventors: Amitava Bose, Nashua, N.H.; Marion M. Garver; Andre I. Nasr, both of Marlborough, Mass.; Steven S. Cooperman, Southborough, Mass.

[73] Assignee: Digital Equipment Corporation, Maynard, Mass.

[21] Appl. No.: 230,180

[22] Filed: Apr. 20, 1994

[51] Int. Cl.⁶ ............................................. H01L 21/76
[52] U.S. Cl. ..................... 437/67; 437/228; 437/247; 437/63; 148/DIG. 50
[58] Field of Search ........................... 437/67, 228, 63, 437/64, 68, 247; 148/DIG. 50

[56] References Cited

U.S. PATENT DOCUMENTS

| | | | |
|---|---|---|---|
| 4,104,086 | 8/1978 | Bondur et al. | 437/67 |
| 4,526,631 | 7/1985 | Silvestri et al. | 148/175 |
| 4,571,819 | 2/1986 | Rogers et al. | 448/DIG. 50 |
| 4,666,556 | 5/1987 | Fulton et al. | 156/643 |
| 4,671,851 | 6/1987 | Beyer et al. | 156/645 |
| 4,745,081 | 5/1988 | Beyer et al. | 437/38 |
| 4,783,238 | 11/1988 | Roesner | 156/649 |
| 4,876,216 | 10/1989 | Tobias et al. | 437/67 |
| 5,077,234 | 12/1991 | Scoopo et al. | 437/67 |
| 5,130,268 | 7/1992 | Liou et al. | 437/67 |
| 5,173,439 | 12/1992 | Dash et al. | 437/67 |
| 5,175,122 | 12/1992 | Wang et al. | 437/67 |
| 5,177,028 | 1/1993 | Manning | 437/41 |
| 6,689,656 | 8/1987 | Silvestri et al. | 357/49 |

FOREIGN PATENT DOCUMENTS 341898A  11/1989  European Pat. Off. .

OTHER PUBLICATIONS

Becker; "Low Pressure Deposition of Doped SiO₂ by Pyrolysis of Tetraethylorthesilicate (TEOS)"; J. Electrochem. Soc: Solid State Science and Technology; vol. 134, No. 11, pp. 2923–2931; Nov. 1987.

T. H. Daubenspeck, J. K. DeBrosse, C. W. Koburger, M. Armocost, and J. R. Abernathey, "Planarization of ULSI Topography Over Variable Pattern Densities", J. Electrochem. Soc., vol. 138, No. 2, pp. 506–509, Feb. 1991.

B. Davari, C. W. Koburger, R. Schulz, J. D. Warnock, T. Furukawa, M. Jost Y. Taur, W. G. Schwittek, J. K. DeBrosse, M. L. Kerbaugh, and J. L. Mauer, "A New Planarization Technique, Using A Combination of RIE And Chemical Mechanical Polish (CMP)", IEDM Technical Digest, pp. 3.4.1–3.4.4, 1989.

D. J. Sheldon, C. W. Gruenshclaeger, L. Kammerdiner, N. B. Henis, P. Kelleher, and J. D. Hayden, "Application Of a Two–Layer Planarization Process To VLSI Intermetal Dielectric And Trench Isolation Processes", IEEE Transactions Semiconductor Manufacturing, 1, No. 4, 140–145, Nov. 1988.

*Primary Examiner*—Brian E. Hearn
*Assistant Examiner*—Trung Dang
*Attorney, Agent, or Firm*—Arthur W. Fisher; Denis G. Maloney

[57] ABSTRACT

Disclosed is a method of planarizing the surface of a silicon wafer in integrated circuit manufacture where shallow trench isolation techniques are employed. The etched trenches are first coated with a silicon nitride protective liner before the trenches and active area mesas are conformally coated with a layer of silicon oxide. The conformal oxide then is steam annealed to densify the conformal oxide, and then the surface of the silicon wafer is etched and polished back down to the tops of the active area mesas, to form a substantially planar surface.

12 Claims, 2 Drawing Sheets

SHALLOW TRENCH ISOLATION PROCESS FOR HIGH ASPECT RATIO TRENCHES

FIELD OF THE INVENTION

The present invention relates to semiconductor devices, and, in particular, is directed to a method of planarization in integrated circuit (IC) manufacture where shallow trench isolation (STI) is employed.

BACKGROUND OF THE INVENTION

Device isolation typically is achieved by utilizing local oxidation of silicon ("LOCOS") or shallow trench isolation ("STI") techniques. In the STI device isolation technique, isolation commonly is provided by forming a recess or trench between two active areas, upon which the electronic devices are located, and filling the trench with an isolation material. Shallow trench isolation serves to provide higher packing density, improved isolation, and greater planarity, by avoiding the topographical irregularities encountered when using conventional thick film oxide isolation (LOCOS). In particular, the growth of thermal field oxide using a mask, such as nitride, creates an encroachment of the oxide into the active areas; this encroachment is referred to as the bird's beak effect.

Trench isolation technology includes a planarization process to remove oxide from the active areas and maintain oxide in the trenches. However, in some areas of the wafer face, there will be narrow trenches with narrow active areas between them, while in others there will be wide active areas and wider trenches. Various combinations of trench width and active area width occur, as well, at other places along the face of the wafer due to variations in circuit density. Because of these varying pattern densities, a sufficient degree of uniform planarization sometimes is not achieved. Improved planarity especially is important as device geometries shrink, reducing the photolithography depth of focus at subsequent patterning steps.

Several techniques specifically have been developed for planarization of wafer surfaces as part of trench isolation processing. For example, conformal oxide deposition with etchback has been used successfully to produce local smoothing and planarization, but etching into the trenches does occur when the technique is applied to wide trenches. Another technique for planarization employs spin-on photoresist or glasses, followed by etchback; again, the smoothing is dependent upon the trench geometries, and global planarization is not achieved when variable circuit density is encountered.

While prior techniques have been able to produce adequate planarization over local regions, none of the techniques have been able to accomplish global planarization over large areas of diverse trench patterns. Improved global planarity has been reported by using a two-layer photoresist approach, wherein the first layer is patterned to provide a uniform surface for coating by the second layer. The two layer stack then is etched back to the original level, leaving an essentially planar surface.

An improved resist etch-back technique using three resist layers also has been developed which offers enhanced planarity over the two-resist layers process. In the three-resist layer process, following deposition of a conformal oxide onto a wafer with patterned trenches, the first resist coat is patterned into the trenches to minimize the gap volume prior to the second resist coat, in a manner similar to the technique described above. The second coat then creates a relatively planar resist surface. However, due to photolithographic alignment considerations, there exists a set of trench widths that are too small to receive a resist block, and so the resist is too thin both in these small trenches and on adjacent small active areas. The second coat is therefore etched back in an oxygen chemistry, and a third resist coat is applied, which improves the planarity by increasing the amount of resist in the trenches without a resist block and on the adjacent small active areas. Following the third resist coat, the resist and oxide are then etched back to the silicon nitride with 1:1 selectivity.

Even with the three resist coats, the nonplanarity between the active area/trench regions with and without the resist block results in significant non-planarity across the die following the etch-back. Because of the thinner resist on active areas adjacent to trenches with no resist block, the oxide on these areas will clear first during the etch, and will continue to etch along the active area sidewall while waiting for larger active areas to clear. Another problem is that a final etch step with reduced resist etch rate is required to avoid punching through the trenches with no resist block, resulting in the appearance of oxide spikes adjacent to the active areas when the remaining resist above the trenches is subsequently stripped. The exposure of the active area sidewall and the oxide spikes can be avoided by leaving a small amount of oxide on the active areas, and performing a chemical mechanical polish until the oxide is completely removed from the nitride on all features. The polishing step smoothes the wafer surface and provides global planarization. The polishing step also makes the planarization process less sensitive to variations in localized resist non-planarity.

The combined resist etch-back with chemical mechanical polish process therefore offers a signifantly improved shallow-trench isolation process, but there are still several problems associated with the technique 1) the multiple resist coats and etches associated with resist etch-back result in accumulated tolerances that make the process difficult to control, even with the final chemical mechanical polish step; 2) the final nitride thickness range varies significantly between various active area/trench structures, due to both resist etch-back (e.g., active area structures adjacent to trenches with no filler have less oxide and so will polish to nitride more quickly) and chemical mechanical polish (e.g., small isolated active areas will polish more rapidly than large and/or dense active areas, even with the significantly reduced step height provided by resist etch-back); the result is that a significantly thicker nitride layer remains on large active areas than on small active areas, and so following the nitride strip the step height will vary depending on the feature size and pattern density, and a fairly large step will remain adjacent to large active areas; 3) the field oxide will be polished in wide trenches during chemical mechanical polish (a phenomenon referred to as dishing), reducing the final global planarity; 4) some pad deformation will occur across very large active areas, requiring an extended over-polish to ensure removal of oxide from the center of these features; this increases the nitride thickness range described in problem (2), and worsens planarity due to the slower polish rate of the nitride relative to the field oxide; 5) the extent of the effects described in problems (2), (3), and (4), will vary from on chip design to another, depending on the size of the largest active area, the proximity of large active areas to one another, the spacing between small isolated active areas, and the largest trench width. These effects can be reduced but not eliminated with undesirable layout rules imposed on circuit designs.

Special problems are encountered in dealing with high aspect ratio trenches, encountered, for example, in sub-half micron technology. When depositing conformal oxide to fill a high aspect ratio trench, a verticle seam inherently occurs along the center of the trench where the outer surface of oxide layers deposited along opposing verticle trench walls meet. After the deposition of the conformal trench oxide, the oxide fill in the trenches then, typically, is annealed to effect densification of the oxide. Densification of the deposited oxide is required to enhance resistance of the oxide to etching during subsequent processing. This annealing step is conducted in a nitrogen atmosphere, in order to prevent oxidation of the silicon substrate beneath the trench oxide. Following densification, the wafer surface is planarized by means of resist etch-back techniques with a filler mask followed by resist strip, and polishing down to the nitride by means of chemical-mechanical polishing ("CMP"). The chemical-mechanical polishing step is followed by several wet etch steps using hydrofluroic acid ("HF"). These wet etch steps are required for the formation of the gate dielectric on the active area and post-CMP cleanup. During the HF etch operation, the above-mentioned seam running along the center of the trench, tends to etch faster than the contiguous oxide, eventually resulting in the formation of a groove along the top surface of the seam. The seam along the outer edges of the trench, where the oxide filler abuts the sidewalls of the trench, also is a weak point subject to excessive etching and attendant grooving. These seams which are exposed and opened up during etching may act as traps for polysilicon residue, during later processing, leading to polysilicon shorts between adjacent polysilicon lines in the finished chip circuitry. Secondly, a high wet etch rate of the deposited formal conformal oxide leads to considerable amount of recess in the trench oxide; the exposed corner of the active area mesas and the trench sidewall become part of the gate dielectric and may lead to lower gate oxide integrity.

SUMMARY OF THE INVENTION

Now, an improved shallow trench isolation process has been developed, whereby high aspect ratio trenches filled with dielectric material exhibit a high degree of integrity and planarity. According to the presently invented process, a layer of dielectric material is conformally deposited onto a semiconductor substrate which features active area mesas separated by shallow trenches. This topography typically is formed by depositing silicon nitride, usually with a thermal oxide base coating, over a silicon semiconductor substrate, and then patterning and etching trench areas using conventional photographic techniques and reactive ion etching. The deposited dielectric layer is of uniform thickness and conforms into the etched surface of the substrate to form depressions above wide, low aspect ratio trenches, but completely fill narrow, high aspect ratio trenches where the outer surface of the oxide coating on one side-wall of the trench abuts with the outer surface of the oxide coating on an opposing wall. Critical to the present process, prior to the deposition of the dielectric layer, a thin layer of silicon nitride first is conformally deposited on the thermally oxidized etched surfaces of the trenches. This nitride layer serves two important purposes. Firstly, the nitride provides a more receptive surface than the thermal oxide coating to form a more durable bond with the conformal dielectric filler material; the dielectric deposition process has a propensity to deposit a more porous and thin film on a thermal oxide surface than on a nitride surface. Secondly, the nitride shields the underlying thermal oxide and/or substrate from oxidation during subsequent processing. Specifically, the nitride liner allows the deposited dielectric material to be densified by annealing in a steam atmosphere, rather than under nitrogen. Steam densification operates to increase the etch resistance of the dielectric material, and, thus, avoid recessing of the dielectric filler in the trenches and prevent the formation of etch grooves down the center of the trench, as well as the seam where the filler dielectric material meets the trench sidewall. The nitride liner also serves to protect the silicon active areas from contamination during subsequent process steps, since nitride or oxynitride is a better barrier than oxide.

The present invention effectively allows for conventional shallow trench isolation technology to be utilized for application with high aspect ratio trenches, without compromising field isolation characteristics. The invented process can be advantageously used in high density integrated circuit fabrication where silicon real estate is at a premium and reliabilty is of primary concern.

BRIEF DESCRIPTION OF THE DRAWINGS

For a further understanding of the nature of the present invention, as well as other features and advantages thereof, reference should be made to the following detailed description taken in conjunction with the accompanying drawings wherein.

DETAILED DESCRIPTION OF PREFERRED EMBODIMENTS

Figure 1:
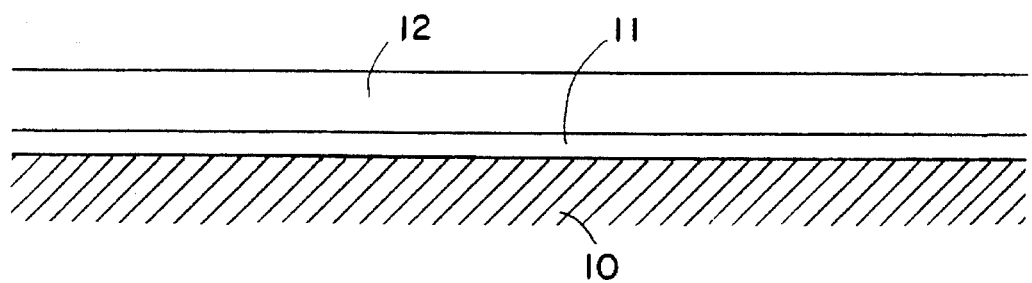
FIG. 1 is a simplified, magnified, cross-sectional view of a semiconductor substrate.

Referring to FIG. 1, a silicon semiconductor substrate 10 is shown, which is coated with a thermally grown oxide layer 11 and a deposited silicon nitride layer 12. Typical thickness dimensions for such layers on a silicon substrate would be a thermal oxide layer of about 250 Å and a deposited nitride layer of about 1800 Å.

In order to define and form shallow trenches and active area mesas, a photoresist is applied to cover the nitride layer 12, and the face of the silicon substrate then is exposed to light through a mask defining the desired pattern of trenches. The photoresist is developed, and then is subjected to an anisotropic etch, typically a conventional plasma etch system, such as "RIE", reactive ion etch, with either $Cl_2$ or $Cl_2$ and HBr, to create trenches, such as 20, 21, and 22 between active mesa areas 31, 32, 33, and 34, as illustrated in FIGS. 2, 3, 4, and 5. A typical trench depth is about 0.4 to about 0.5 µm. High aspect ratio trenches, such as 20 and 21, generally defined as having an aspect ratio (depth/width) ranging from about 1.5 to about 2.0, typically have as width of about 0.25 to about 0.35 µm. After etching patterned trenches, the photoresist then is stripped and a thermal oxide 13 grown to a thickness of about 250 Å.

Figure 2:
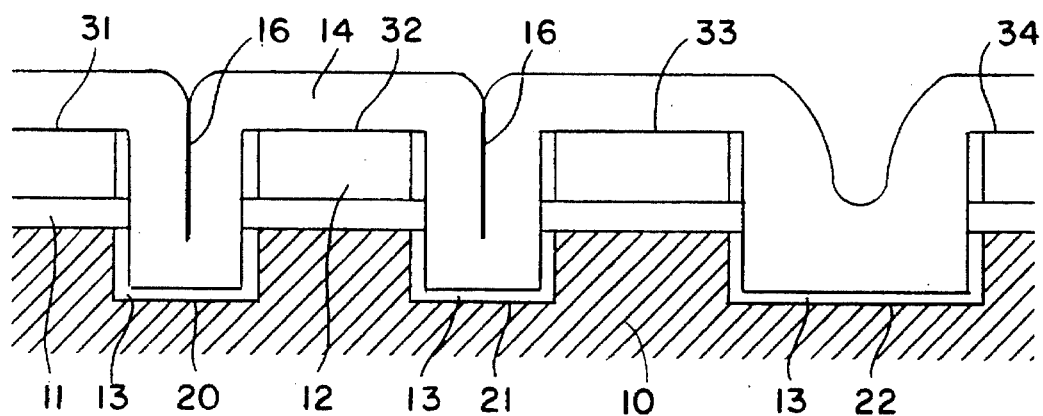
FIGS. 2 and 3 are simplified, magnified, cross-sectional views depicting prior art process steps for fabricating semiconductor devices, resulting in high aspect ratio trench isolation flaws.

Next, according to prior art processes, to form the conventional structure as shown in FIG. 2, a conformal dielectric layer, in this example oxide coating 14, would be deposited onto the substrate. The conformal dielectric layer preferably is a silicon oxide, or a material convertible to a silicon oxide. The intended purpose of the conformal oxide is to present a planar surface featuring uniform polishing rate across the surface of the substrate. The conformal oxide, preferably by thermal decomposition of TEOS (tetraethylorthosilicate), forms an oxide coating of uniform thickness that coats the sidewalls and base of the trenches at the same thickness as the coating of the flat face surface areas. The oxide generally is applied at a thickness so that the level of the top of oxide 14 in the trenches is at at least about the same level as the top of the nitride layer 12 on the active areas. A typical thickness of the oxide coating 14 is about 6500 Å.

Figure 3:
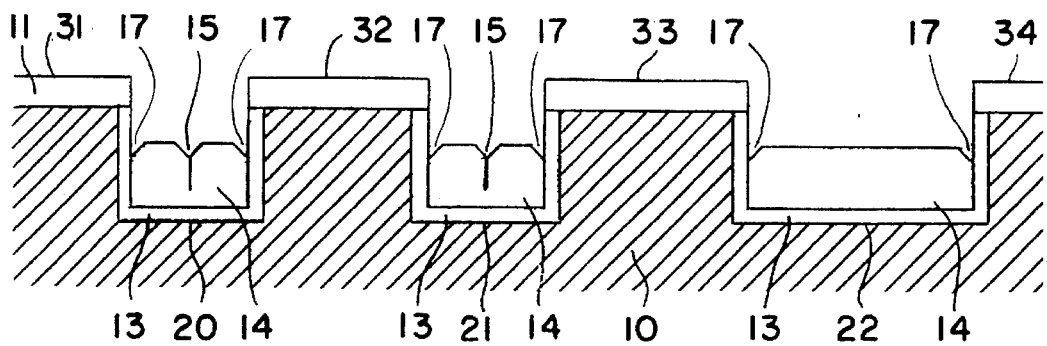

Once the oxide coating is applied, it then is annealed at about 1050° C. in a nitrogen atmosphere to densify the oxide. After densification the wafer is planarized by means of "REB", resist etch back processing, with a filler mask. Following REB and the resist strip, the wafers are polished down to the nitride by means of "CMP", chemical-mechanical polishing. Then, the remaining nitride on the mesa areas is removed by means of wet etching, and the wafer is subjected to four different HF, hydrogen fluoride, acid-cleaning steps. First, after CMP, the wafer is etched in 100:1 HF for about 9–18 minutes; next there is a short HF step before the nitride strip; and, finally, the last two HF steps are the gate 1 dip and the post gate 2 clean dip. Estimating a wet etch rate of the nitrogen annealed—densified deposited oxide to be 1.4 times greater than the etch rate for thermal oxide, the cumulative effect of the HF etching steps would be to remove about 850 Å of deposited oxide from the top of the trench. FIG. 3 is a cross-sectional view of a conventional wafer after the HF steps, and illustrates the non-uniform topography of the deposited trench oxide caused by break-down along central seams 16 and edges which were exposed and opened up during the planarization steps. The resulting seam grooves 15 and edge grooves 17 are flaws that act as traps for polysilicon residue during subsequent processing steps and lead to interpolysilicon shorts.

Figure 4:
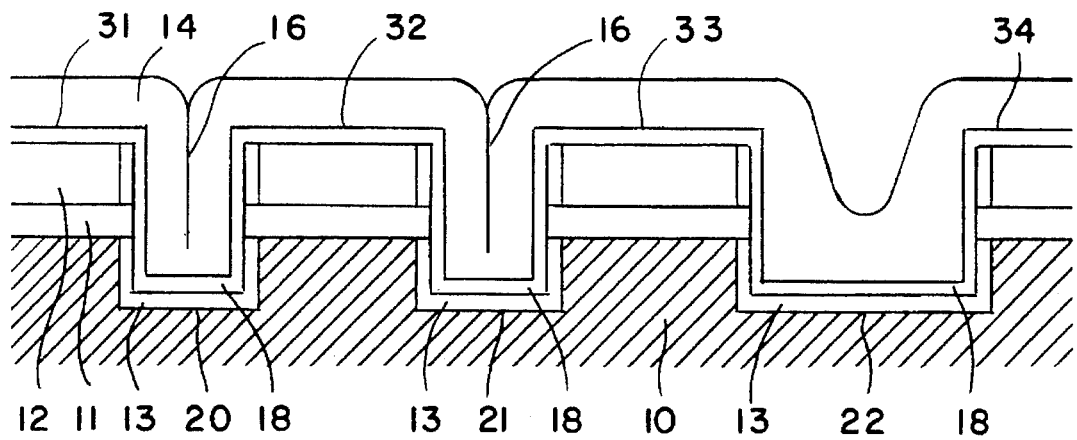
FIGS. 4 and 5 are simplified, magnified, cross-sectional views depicting, in sequence, the process steps for planarization of shallow trenches according to the present invention.

In order to avoid the problems illustrated in FIG. 3, according to the invented process, a liner of silicon nitride 18, as shown in FIG. 4, is deposited on the walls and base of the trenches prior to the deposition of the conformal dielectric layer 14. This liner of silicon nitride typically has a thickness of about 0.0100 to about 0.0150 μm. The presence of the nitride liner shields the silicon substrate, and/or the optional thermal oxide layer, and enables the implementation of a steam atmosphere annealing step to densify the deposited oxide to the degree necessary to match the etch rate of thermal oxide during subsequent etching steps. The nitride liner allows the deposited oxide to be steam densified without adversely oxidizing the underlying silicon and/or thermal oxide. The steam annealing step typically involves treating the wafer at a temperature of about 1000° C. to about 1100° C. in a steam ambient for about 60 to about 90 minutes. Depending on choice of nitride liner thickness and annealing temperature, the annealing step in a nitrogen atmosphere may be eliminated. However, this nitrogen anneal may still be desirable, since it does serve to densify the nitride and fortify it against oxidation attack during the steam anneal. Breakdown of the nitride during steam anneal would result in exposing the substrate to oxidation.

Figure 5:
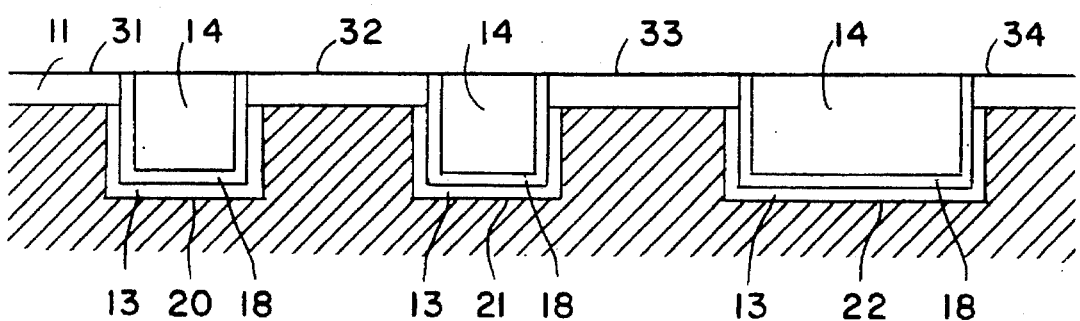

As shown in FIG. 5, after REB, CMP, and HF cleaning, as described above, the steam-annealed deposited trench oxide features a planar surface without over-etch or grooving.

While the invention has been described with reference to specific embodiments thereof, it is intended that all matter contained in the above description or shown in the accompanying drawings be interpreted as illustrative and not limiting in nature. Various modifications of the disclosed embodiments, as well as other embodiments of the invention, will be apparent to those skilled in the art upon reference to this description, or may be made without departing from the spirit and scope of the invention defined in the appended claims.

We claim:

1. A method of planarizing a face of a semiconductor substrate comprising:

etching said face to form trenches between flat active area mesas;

depositing a liner of silicon nitride on the walls and base of the trenches;

depositing a conformal coating of an undoped dielectric material over said face;

annealing the conformal undoped dielectric material in a steam atmosphere to densify the undoped dielectric material; and planarizing the undoped densified dielectric conforming coating down to the level of the tops of the flat active area mesas to form a substantially planar surface.

2. The method of claim 1 further comprising the step of depositing silicon dioxide on the walls of said trenches and wherein the silicon nitride liner has a thickness of about 0.010 to about 0.015 μm and is deposited directly on the silicon dioxide.

3. The method of claim 2 wherein the annealing step is conducted in a steam atmosphere at a temperature of about 1000° C. to about 1100° C. for about 60 to about 90 minutes.

4. The method of claim 1 wherein the depth of the etched trenches is about 0.4 to 0.5 μm, and include a plurality of high aspect ratio trenches.

5. The method of claim 1 wherein the conformal undoped dielectric material is a silicon oxide.

6. The method of claim 5 wherein the silicon oxide material is deposited from tetraethylorthosilicate.

7. The method of claim 1 wherein the undoped dielectric material is deposited in a thickness so that trenches are filled at least to about the level of the top of the active area mesas.

8. The method of claim 1 including a nitrogen atmosphere annealing step prior to the steam atmosphere annealing step.

9. The method of claim 1 wherein the semiconductor substrate is silicon.

10. A method of planarizing a face of a silicon substrate comprising:

etching said face to form flat active area mesas and trenches including a plurality of high aspect ratio trenches;

depositing a liner of silicon nitride on the walls and base of the trenches, said liner having a thickness of about 0.010 to about 0.015 μm;

depositing a conformal coating of undoped silicon oxide over said face, in a thickness such that the level of the top of the undoped conformal oxide in the trenches is at least about the same level as the top of the active area mesas;

annealing the undoped conformal oxide material in a steam atmosphere; and, etching and polishing the undoped conformal oxide coating down to the level of the tops of the active area mesas, to form a substantially planar surface.

11. The method of claim 10 including a nitrogen atmosphere annealing step prior to the steam atmosphere annealing step.

12. The method of claim 10, further comprising the step of depositing silicon dioxide on the walls of said trenches and wherein the silicon nitride liner has a thickness of about 0.010 to about 0.015 µm and is deposited directly on the silicon dioxide.

* * * * *